(12) United States Patent
Tsukazaki et al.

(10) Patent No.: US 11,543,468 B2
(45) Date of Patent: Jan. 3, 2023

(54) HALL ELEMENT

(71) Applicant: TOHOKU UNIVERSITY, Miyagi (JP)

(72) Inventors: Atsushi Tsukazaki, Miyagi (JP); Kohei Fujiwara, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 17/269,566

(22) PCT Filed: Aug. 22, 2019

(86) PCT No.: PCT/JP2019/032898
§ 371 (c)(1),
(2) Date: Apr. 13, 2021

(87) PCT Pub. No.: WO2020/040264
PCT Pub. Date: Feb. 27, 2020

(65) Prior Publication Data
US 2021/0293905 A1    Sep. 23, 2021

(30) Foreign Application Priority Data
Aug. 24, 2018    (JP) .............................. JP2018-157542

(51) Int. Cl.
*G01R 33/07* (2006.01)
*G01R 33/09* (2006.01)
(Continued)

(52) U.S. Cl.
CPC ........... *G01R 33/07* (2013.01); *G01R 33/093* (2013.01); *H01L 43/04* (2013.01); *H01L 43/065* (2013.01); *H01L 43/08* (2013.01); *H01L 43/10* (2013.01)

(58) Field of Classification Search
CPC ...... G01R 33/093; H01L 43/04; H01L 43/065
See application file for complete search history.

(56) References Cited

U.S. PATENT DOCUMENTS

| 2003/0039062 A1* | 2/2003 | Takahasahi ............ B82Y 25/00 |
| 2005/0007694 A1* | 1/2005 | Takahashi .............. B82Y 25/00 |

(Continued)

FOREIGN PATENT DOCUMENTS

| JP | H03129707 | * | 6/1991 | ............. G11B 5/127 |
| JP | H03129707 A |   | 6/1991 | |

(Continued)

OTHER PUBLICATIONS

E. Haftek, M. Tan, J.A. Barnard, "Microstructure and magnetic properties of ferromagnetic Fe—Sn alloy thin films," Ultramicroscopy 47 p. 400-p. 407 (1992).

(Continued)

*Primary Examiner* — Alvaro E Fortich
(74) *Attorney, Agent, or Firm* — Fox Rothschild LLP; Robert J. Sacco; Carol E. Thorstad-Forsyth

(57) ABSTRACT

A Hall element that exhibits an anomalous Hall effect includes a substrate and a thin film as a magneto-sensitive layer on the substrate, the thin film having a composition of $Fe_xSn_{1-x}$, where $0.5 \leq x < 0.9$. The thin film may be made of an alloy of Fe and Sn, and a dopant element. The dopant element may be a transition metal element that modulates spin-orbit coupling or magnetism. The dopant element may be a main-group element that has a different number of valence electrons from Sn and modulates carrier density. The dopant element may be a main-group element that modulates density of states.

9 Claims, 22 Drawing Sheets

(51) Int. Cl.
    *H01L 43/04*     (2006.01)
    *H01L 43/06*     (2006.01)
    *H01L 43/08*     (2006.01)
    *H01L 43/10*     (2006.01)

(56) References Cited

U.S. PATENT DOCUMENTS

| | | | |
|---|---|---|---|
| 2007/0046285 A1* | 3/2007 | Arima | B82Y 35/00 |
| | | | 324/207.2 |
| 2007/0154629 A1* | 7/2007 | Fujita | C03C 17/25 |
| | | | 427/126.3 |
| 2008/0024120 A1* | 1/2008 | Sasaki | H04M 1/0245 |
| | | | 324/207.21 |
| 2012/0241809 A1* | 9/2012 | Pan | H01L 33/24 |
| | | | 257/E33.072 |
| 2017/0148977 A1* | 5/2017 | Zhu | H01F 10/16 |

FOREIGN PATENT DOCUMENTS

| | | | | |
|---|---|---|---|---|
| JP | H0574709 A | | 3/1993 | |
| JP | 2001102656 A | | 4/2001 | |
| JP | 200216330 A | | 1/2002 | |
| JP | 2003069107 A | | 3/2003 | |
| JP | 2004165362 A | | 6/2004 | |
| JP | 2013197165 A | | 3/2012 | |
| JP | 2013197165 | * | 9/2013 | ............ H01L 43/06 |

OTHER PUBLICATIONS

Jun Gao, Fei Wang, Xiaolong Jiang, Gang Ni, Fengming Zhang, and Youwei Du, "Giant Hall effect in FexSn100-x granular alloy films," Journal of Applied Physics 93, 1851 (2003).

\* cited by examiner

FIG. 9A  x-bent
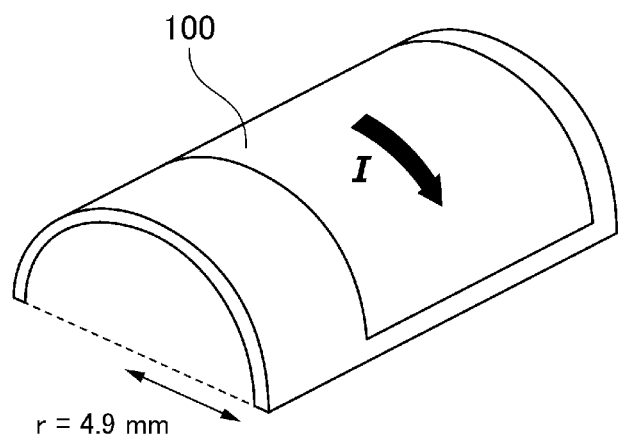
FIG. 9B  y-bent
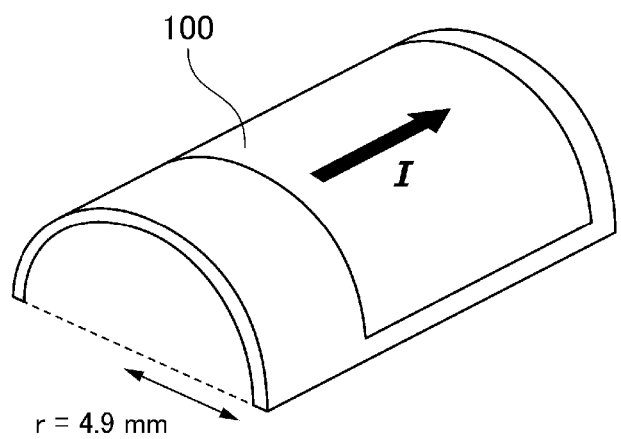

FIG. 11

| Dopant X | Sample ID | d (nm) | $\rho_{yx}$ at 2T ($\mu\Omega$ cm) | $\rho_{yx}/\rho_{xx}$ at 2T | $d\rho_{yx}/dB$ at $B \leq 0.2T$ ($\mu\Omega$ cm/T) | Carrier density ($10^{21}$cm$^{-3}$) | Fe : Sn : X (EDX) | Doping level X / (Fe + X) |
|---|---|---|---|---|---|---|---|---|
| None | N1 | 43 | 5.00 | 0.024 | 13.7 | -- | 0.496 : 0.504 : 0.000 | 0.00 |
| None | N2 | 42 | 8.98 | 0.042 | 16.7 | 5.73 | 0.602 : 0.398 : 0.000 | 0.00 |
| None | N3 | 45 | 8.40 | 0.050 | 10.6 | -- | 0.670 : 0.330 : 0.000 | 0.00 |
| None | N4 | 33 | 6.83 | 0.049 | 6.19 | -- | 0.773 : 0.227 : 0.000 | 0.00 |
| None | N5 | 41 | 3.88 | 0.046 | 2.42 | -- | 0.830 : 0.170 : 0.000 | 0.00 |

FIG. 12A

| Dopant X | Sample ID | d (nm) | $\rho_{yx}$ at 2T (μΩ cm) | $\rho_{yx}/\rho_{xx}$ at 2T | $d\rho_{yx}/dB$ at $B \leq 0.2T$ (μΩ cm/T) | Carrier density ($10^{21}$cm$^{-3}$) | Fe : Sn : X (EDX) | Doping level X / (Fe + X) |
|---|---|---|---|---|---|---|---|---|
| None | N2 | 42 | 8.98 | 0.042 | 16.7 | 5.73 | 0.602 : 0.398 : 0.000 | 0.00 |
| Ta | T1 | 46 | 9.70 | 0.046 | 16.5 | 6.88 | 0.537 : 0.346 : 0.117 | 0.18 |
| Ta | T2 | 41 | 8.80 | 0.026 | 17.1 | 5.07 | 0.524 : 0.337 : 0.139 | 0.21 |
| Ta | T3 | 38 | 10.2 | 0.033 | 20.6 | 5.57 | 0.498 : 0.323 : 0.179 | 0.27 |
| Ta | T4 | 37 | 11.4 | 0.047 | 20.2 | 4.39 | 0.491 : 0.278 : 0.231 | 0.32 |
| Ta | T5 | 50 | 11.7 | 0.032 | 29.1 | 3.00 | 0.446 : 0.326 : 0.228 | 0.34 |
| Ta | T6 | 53 | 9.47 | 0.027 | 25.7 | 2.23 | 0.434 : 0.313 : 0.253 | 0.37 |
| Ta | T7 | 63 | 7.92 | 0.023 | 27.7 | 1.47 | 0.381 : 0.379 : 0.240 | 0.39 |
| Ta | T8 | 58 | 3.40 | 0.015 | -- | -- | 0.386 : 0.309 : 0.305 | 0.44 |
| Ta | T9 | 65 | 1.08 | 0.0033 | -- | -- | 0.346 : 0.293 : 0.361 | 0.51 |

FIG. 12B

| Dopant X | Sample ID | $d$ (nm) | $\rho_{yx}$ at 2T (μΩ cm) | $\rho_{yx}/\rho_{xx}$ at 2T | $d\rho_{yx}/dB$ at $B \leq 0.2T$ (μΩ cm/T) | Carrier density ($10^{21}$cm$^{-3}$) | Fe : Sn : X (EDX) | Doping level X / (Fe + X) |
|---|---|---|---|---|---|---|---|---|
| None | N2 | 42 | 8.98 | 0.042 | 16.7 | 5.73 | 0.602 : 0.398 : 0.000 | 0.00 |
| W | W1 | 40 | 8.96 | 0.026 | 24.1 | 2.79 | 0.551 : 0.349 : 0.100 | 0.15 |
| W | W2 | 41 | 6.57 | 0.027 | 19.4 | 1.68 | 0.541 : 0.325 : 0.134 | 0.20 |
| Mo | O1 | 42 | 7.83 | 0.021 | 23.3 | 2.26 | 0.575 : 0.347 : 0.078 | 0.12 |
| Pt | P1 | 48 | 4.55 | 0.012 | 6.56 | 17.0 | 0.589 : 0.345 : 0.066 | 0.10 |
| Mn | M1 | 48 | 5.61 | 0.022 | 16.2 | 2.64 | 0.409 : 0.360 : 0.231 | 0.36 |

| Dopant X | Sample ID | d (nm) | $\rho_{yx}$ at 2T ($\mu\Omega$ cm) | $\rho_{yx}/\rho_{xx}$ at 2T | $d\rho_{yx}/dB$ at $B \leq 0.2T$ ($\mu\Omega$ cm/T) | Carrier density ($10^{21}$ cm$^{-3}$) | Fe : Sn : X (EDX) | Doping level X / (Sn + X) |
|---|---|---|---|---|---|---|---|---|
| None | N2 | 42 | 8.98 | 0.042 | 16.7 | 5.73 | 0.602 : 0.398 : 0.000 | 0.00 |
| In | I1 | 41 | 9.18 | 0.047 | 15.8 | 9.45 | 0.611 : 0.308 : 0.081 | 0.21 |
| In | I2 | 42 | 6.74 | 0.060 | 9.83 | 11.6 | 0.608 : 0.291 : 0.101 | 0.26 |
| Ge | G1 | 47 | 4.19 | 0.016 | 7.40 | 11.8 | 0.583 : 0.300 : 0.117 | 0.28 |

Fe : Sn : In = 0.611 : 0.308 : 0.081

Fe : Sn : Ge = 0.583 : 0.300 : 0.117

HALL ELEMENT

CROSS REFERENCE TO RELATED APPLICATIONS

This application is a § 371 U.S. National Phase Entry of International Patent Application No. PCT/JP2019/032898, filed on Aug. 22, 2019, which claims priority to and the benefit of Japanese Patent Application No. 2018-157542, filed on Aug. 24, 2018, the entireties of which are hereby incorporated herein by reference.

TECHNICAL FIELD

The present invention relates to a Hall element.

BACKGROUND ART

When a magnetic field is applied to a substance perpendicularly to an electric current flowing in the substance, an electromotive force is generated in a direction transverse to both the electric current and the magnetic field. This phenomenon is called the Hall effect. A non-contact magnetic sensor uses the Hall effect to detect a magnetic field induced by an electric current, an earth's magnetic field, or a small magnetic field from a biological body, convert the detected magnetic field into an electrical signal, and output the electrical signal. Such a magnetic sensor is called a Hall element (refer to Patent Literature 1 and Patent Literature 2, for example). The Hall element is built in an electronic device such as a mobile phone, a notebook PC, and a digital camera. In recent years, there is a growing demand for Hall elements.

However, the conventional high-sensitive Hall elements are made of a material such as GaAs, InAs, or InSb, containing toxic arsenic (As) or rare metal indium (In), which requires a careful handling. The conventional Hall elements use the above-mentioned ordinary Hall effect derived from the Lorentz force to detect magnetic fields. In addition, as shown in a sensitivity index described below, the implementation of high mobility materials is essential by controlling crystalline quality or purity of a sample, which imposes a limitation on a sample fabrication method to satisfy such conditions. Specifically, it is necessary to integrate a single-crystalline thin film onto a single-crystalline substrate at high temperature, which leads to higher costs and makes it difficult to add mechanical flexibility to the Hall element. Further, as sensitivity of the Hall element increases, the temperature dependence of the device characteristics is degraded. That is, there is a trade-off relationship between the sensitivity and temperature stability and thus, an IC is required to compensate a sensitivity variation.

Meanwhile, thin films made of iron (Fe) and tin (Sn) that are inexpensive and easily available have been characterized, and the Hall effect of an Fe—Sn alloy has been studied (refer to Non Patent Literature 1 and Non Patent Literature 2).

CITATION LIST

Patent Literature

Patent Literature 1: Japanese Laid-Open Patent Publication No. 2001-102656
Patent Literature 2: Japanese Laid-Open Patent Publication No. H5-74709

Non Patent Literature

Non Patent Literature 1: E. Haftek, M. Tan, J. A. Barnard, "Microstructure and magnetic properties of ferromagnetic Fe—Sn alloy thin films," Ultramicroscopy 47 p. 400-p. 407 (1992).
Non Patent Literature 2: Jun Gao, Fei Wang, Xiaolong Jiang, Gang Ni, Fengming Zhang, and Youwei Du, "Giant Hall effect in $Fe_xSn_{100-x}$ granular alloy films, "Journal of Applied Physics 93, 1851 (2003).

SUMMARY OF INVENTION

Technical Problem

When an electric current flows through a magnetic body, a voltage difference is generated in a direction transverse to both the electric current and magnetization, due to spontaneous magnetization. This phenomenon is called the anomalous Hall effect. Materials that exhibit a giant anomalous Hall effect have been known, but the following problems arise:

(i) Dilute magnetic semiconductors have low temperature stability of anomalous Hall effect characteristics;

(ii) Ordinary crystalline metals show an extremely low resistance, leading to a small Hall voltage and a large noise;

(iii) The anomalous Hall effect has been observed in single crystals and polycrystals which show a considerable variation in properties;

(iv) A thin film is fabricated by a molecular-beam epitaxy method or the like, and a general-purpose technique for fabricating a thin film on a flexible substrate has not been established; and (v) A relationship between a magnetic field and a Hall voltage is not a simple proportional relationship.

The invention has been made in view of the foregoing, and an object of the invention is to provide a Hall element containing a new composition material that exhibits the anomalous Hall effect.

Solution to Problem

A Hall element according to embodiments of the invention exhibits an anomalous Hall effect, and includes a substrate and a thin film as a magneto-sensitive layer on the substrate, the thin film having a composition of $Fe_xSn_{1-x}$, where $0.5 \le x < 0.9$.

A Hall element according to embodiments of the invention exhibits an anomalous Hall effect, and includes a substrate and a thin film as a magneto-sensitive layer on the substrate. The thin film is made of an alloy of Fe and Sn, and a dopant element, and the dopant element is a transition metal element that modulates spin-orbit coupling or magnetism.

A Hall element according to embodiments of the invention exhibits an anomalous Hall effect, and includes a substrate and a thin film as a magneto-sensitive layer on the substrate. The thin film is made of an alloy of Fe and Sn, and a dopant element, and the dopant element is a main-group element that has a different number of valence electrons from Sn and modulates carrier density.

A Hall element according to embodiments of the invention exhibits an anomalous Hall effect, and includes a substrate and a thin film as a magneto-sensitive layer on the substrate. The thin film is made of an alloy of Fe and Sn, and a dopant element, and the dopant element is a main-group element that modulates density of states.

Advantageous Effects of Invention

According to the invention, it is possible to provide a Hall element that contains a non-toxic and inexpensive material, can be fabricated by a general-purpose technique, can also be fabricated on a flexible substrate, and is excellent in properties such as temperature stability.

BRIEF DESCRIPTION OF DRAWINGS

FIG. 9A is a schematic view illustrating a bending effect experiment of an x-bent device that is a Hall element attached to a surface of a semicircular jig.

FIG. 9B is a schematic view illustrating a bending effect experiment of a y-bent device that is a Hall element attached to a surface of a semicircular jig.

FIG. 11 is a table representing properties of Fe—Sn alloys as a non-doped reference sample.

FIG. 12A is a table representing experimental results of adding Ta to an Fe—Sn alloy in Example 2.

FIG. 12B is a table representing experimental results of adding W to an Fe—Sn alloy, adding Mo to an Fe—Sn alloy, adding Pt to an Fe—Sn alloy, and adding Mn to an Fe—Sn alloy, in Example 2.

FIG. 15 is a table representing experimental results of adding In to an Fe—Sn alloy and adding Ge to an Fe—Sn alloy in Example 3.

DESCRIPTION OF EMBODIMENTS

Hereinafter, embodiments of the invention will be described with reference to the drawings. The same reference signs are used to designate the same or similar elements throughout the drawings. The drawings are schematic, and a relationship between a planar dimension and a thickness and a thickness ratio between members are different from reality. Needless to say, there are portions having different dimensional relationships or ratios between the drawings.

First, the configuration of a Hall element 100 according to the embodiments will be described.

Figure 1:
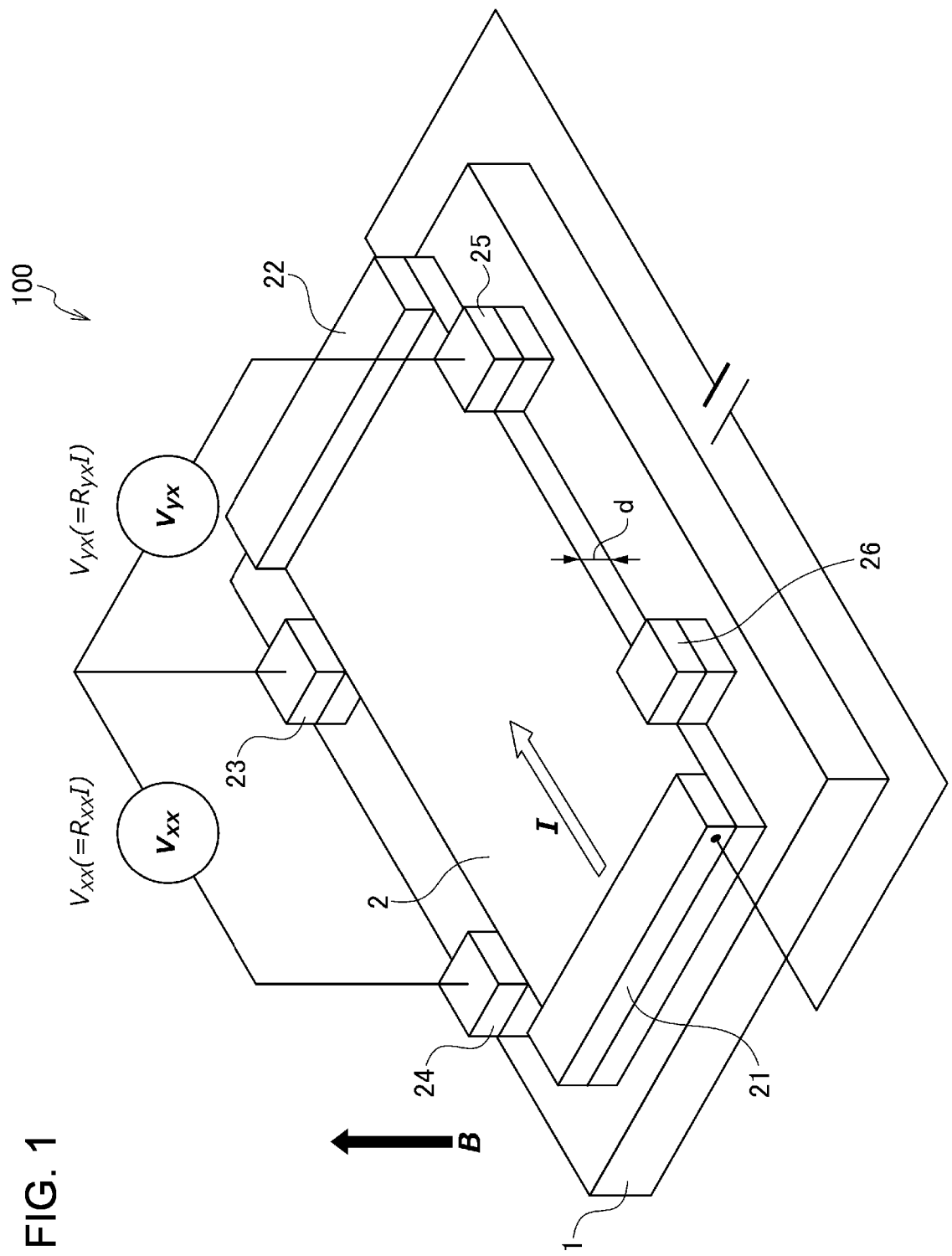
FIG. 1 is a schematic perspective view of a Hall element according to embodiments of the invention.

As shown in FIG. 1, the Hall element 100 includes a substrate 1, and a thin film 2 as a magneto-sensitive layer on the substrate 1. The thin film 2 contains an alloy of Fe and Sn.

Examples of the material of the substrate 1 include, but are not limited to, polyethylene naphthalate (PEN), polyethylene terephthalate (PET), polyimide, glass, sapphire (single-crystalline $Al_2O_3$), alumina ($Al_2O_3$ ceramic), magnesium oxide (MgO), strontium titanate ($SrTiO_3$), quartz ($SiO_2$), silicon (Si), gallium arsenide (GaAs), or indium phosphide (InP).

Figure 2:
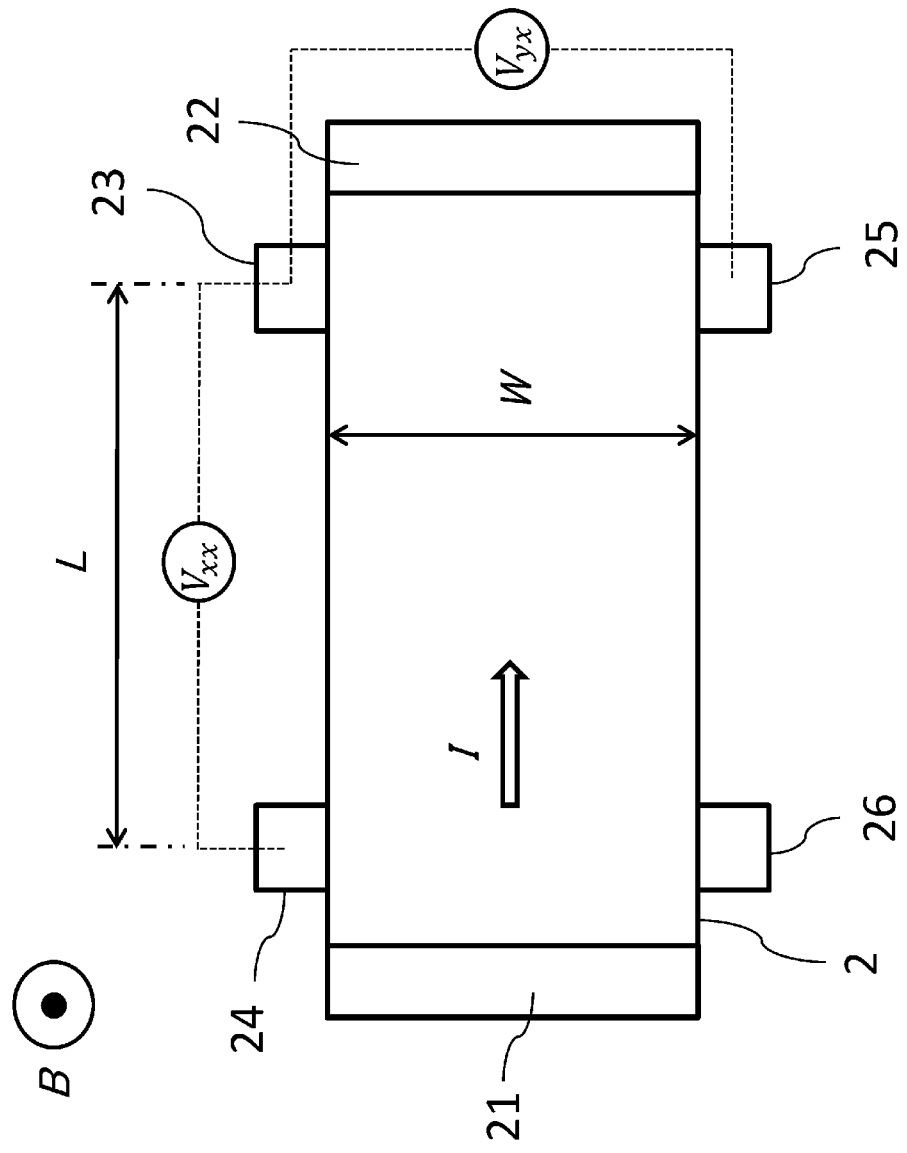
FIG. 2 is a schematic plan view of a thin film of the Hall element shown in FIG. 1.

As shown in FIG. 1 and FIG. 2, the thin film 2 has a Hall-bar structure with six terminals 21 to 26. In the embodiments, a thickness of the thin film 2 is denoted by d, a distance between the terminals 23 and 24 is denoted by L, and a width of the thin film 2 is denoted by W. Instead of the six-terminal Hall-bar structure shown in FIG. 1 and FIG. 2, a four-terminal, cross-shaped Hall-bar structure may be employed.

When a magnetic field B is applied in an out-of-plane direction of the thin film 2, and an electric current I flows between the terminals 21 and 22 by a power-supply voltage, as shown in FIG. 1, a longitudinal voltage $V_{xx}=R_{xx}I$ that is parallel to the electric current I is generated between the terminals 23 and 24, and a Hall voltage $V_{yx}=R_{yx}I$ that is transverse to both the electric current I and the magnetic field B is generated between the terminals 23 and 25. Here, $R_{xx}$ is resistance in a direction that is parallel to the flow of the electric current I (longitudinal resistance), and $R_{yx}$ is Hall resistance. In the embodiments, the terminal 26 is not used in the measurement of the Hall effect.

Reference will be made below to Example 1 in which the thin film 2 is made of an Fe—Sn alloy, and Example 2 and Example 3 in which the thin film 2 is made of a ternary compound of an Fe—Sn alloy and a dopant element (impurities).

Example 1

Example 1 demonstrates the thin film 2 made of an $Fe_xSn_{1-x}$ alloy.

Figure 3:
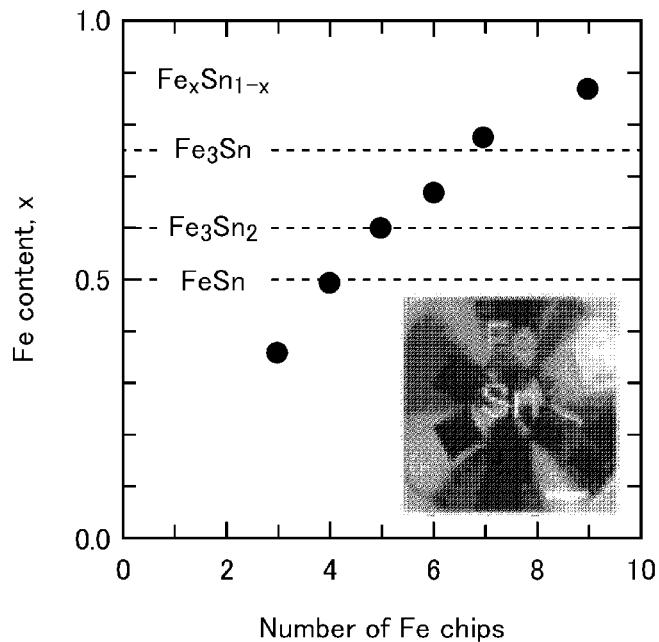
FIG. 3 is a graph showing a relationship between the number of Fe chips and Fe content used in sample fabrication, in $Fe_xSn_{1-x}$ of Example 1.

A $Fe_xSn_{1-x}$ film is prepared by radio-frequency (RF) magnetron sputtering, for example. As shown in the inset of FIG. 3, Fe chips are placed on an Sn target, and an Fe content x in the $Fe_xSn_{1-x}$ film is controlled by changing the number of Fe chips on the Sn target. In the inset of FIG. 3, a white scale bar represents 10 mm. FIG. 3 shows a relationship between the number of Fe chips and the Fe content x. In FIG. 3, x=0.50, 0.60, and 0.75 correspond to FeSn, $Fe_3Sn_2$, and $Fe_3Sn$, respectively. The sputtering as described above is an industrially general-purpose technique, and makes it possible to prepare a highly-uniform thin film and easily spread the thin film over a large area. Alternative techniques for attaining a similar composition of Fe and Sn may include the use of an alloy target in which the composition of Fe and Sn is tuned, or supplying Fe and Sn from different sputtering sources to tune the composition of the thin film. Any of these techniques may be employed.

Figure 4A:
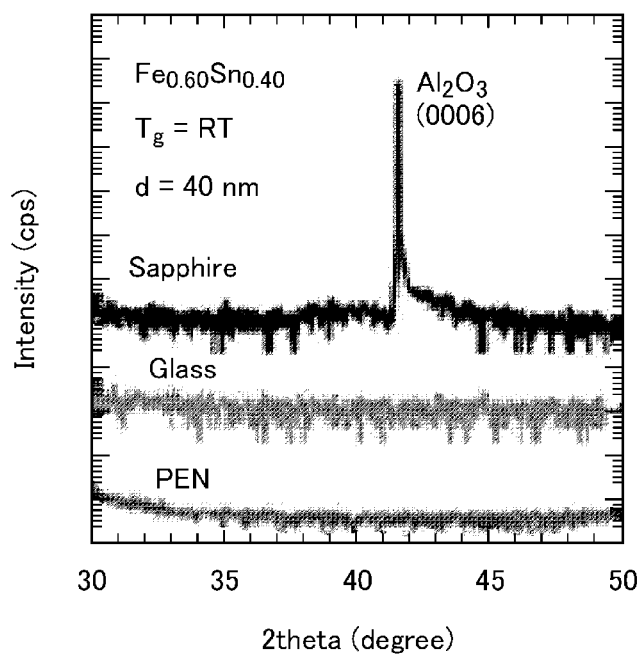
FIG. 4A is a graph showing an X-ray diffraction patterns for $Fe_{0.60}Sn_{0.40}$ films with a film thickness of 40 nm, grown on a sapphire substrate, a glass substrate, and a polyethylene naphthalate sheet substrate at room temperature.

FIG. 4A shows X-ray diffraction (XRD) patterns for $Fe_{0.60}Sn_{0.40}$ films with a film thickness d=40 nm, grown on a sapphire substrate, a glass substrate, and a PEN sheet substrate at room temperature (a growth temperature $T_g$=RT). FIG. 4A indicates that the room-temperature grown samples do not have crystalline character and are expected to have excellent uniformity.

Figure 4B:
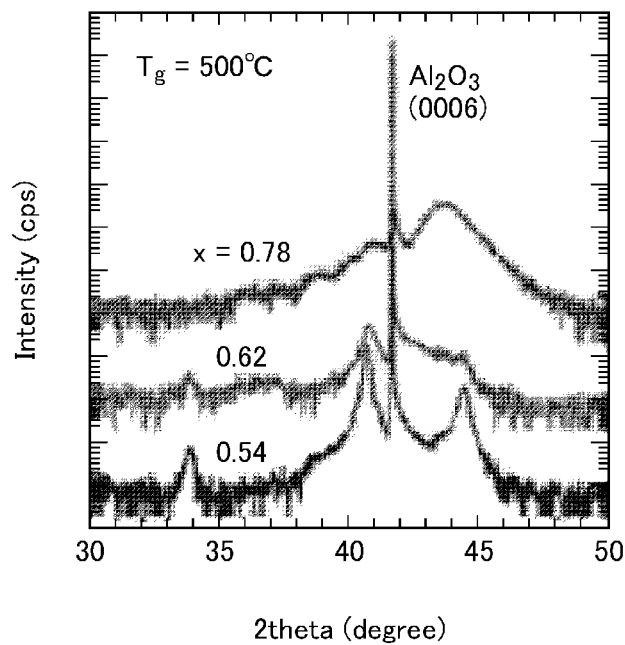
FIG. 4B is a graph showing X-ray diffraction patterns for $Fe_xSn_{1-x}$ films with x=0.54, 0.62, and 0.78 grown on sapphire substrates at 500° C.

FIG. 4B shows XRD patterns for $Fe_xSn_{1-x}$ films with x=0.54, 0.62, and 0.78, grown on sapphire substrates at high temperature ($T_g$=500° C.). The film thicknesses d are approximately 40 nm. FIG. 4B indicates that a crystalline sample can be also prepared by high-temperature growth.

Next, the Hall effect obtained from the measurement of electrical transport properties for $Fe_xSn_{1-x}$ films will be described with reference to FIG. 5A to FIG. 5F. The electrical transport properties are measured using VersaLab (Quantum Design), a physical property measurement system (Quantum Design), and a power-supply measurement unit.

Figure 5A:
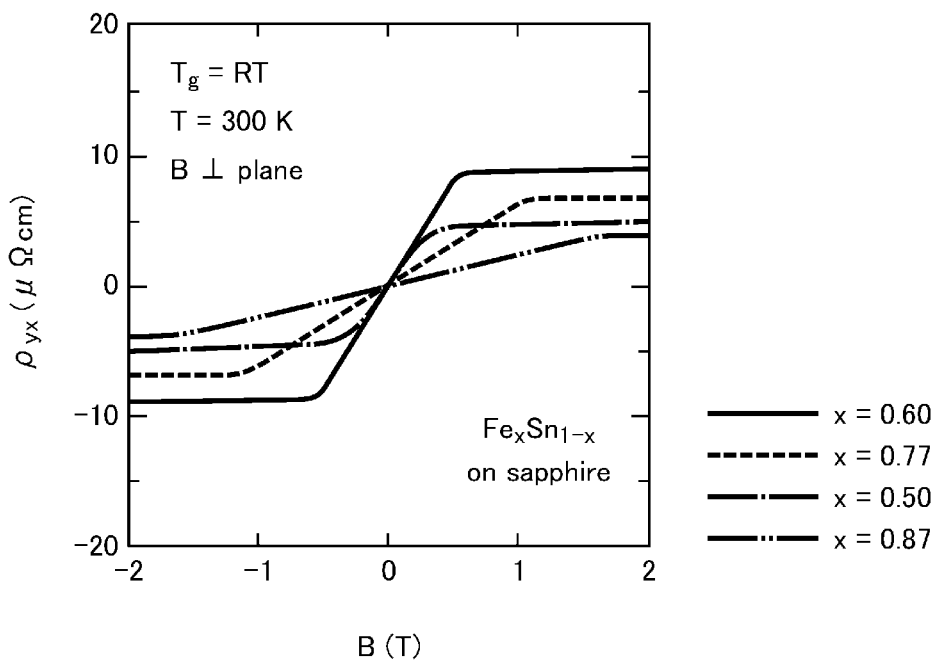
FIG. 5A is a graph showing magnetic field dependence of Hall resistivity when applying a magnetic field in an out-of-plane direction at T=300K to $Fe_xSn_{1-x}$ films with x=0.50, 0.60, 0.77, and 0.87, grown at room temperature.
Figure 5B:
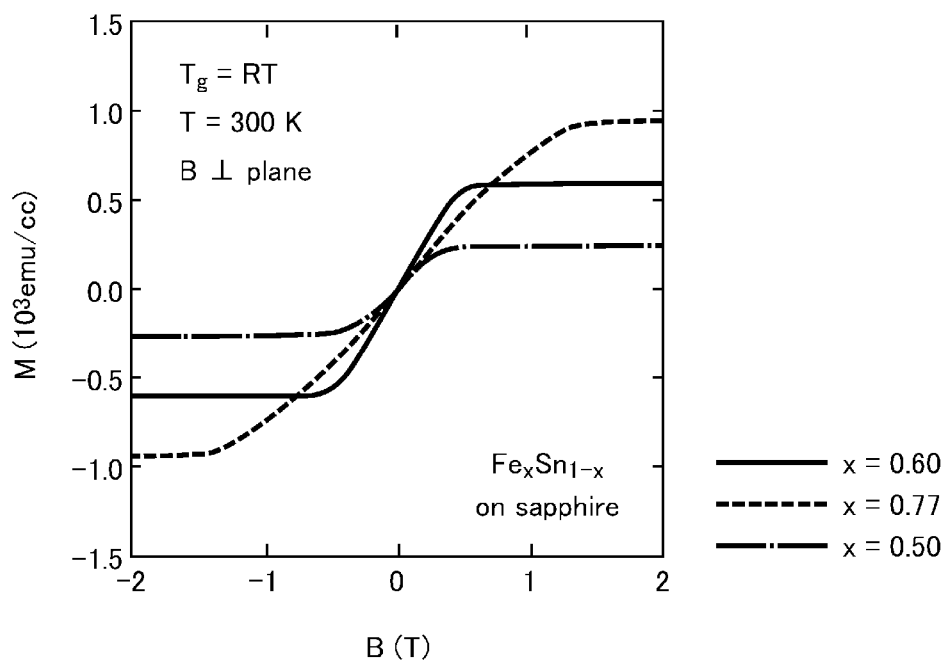
FIG. 5B is a graph showing magnetic field dependence of magnetization when applying a magnetic field in an out-of-plane direction at T=300K to $Fe_xSn_{1-x}$ films with x=0.50, 0.60, and 0.77, grown at room temperature.
Figure 5C:
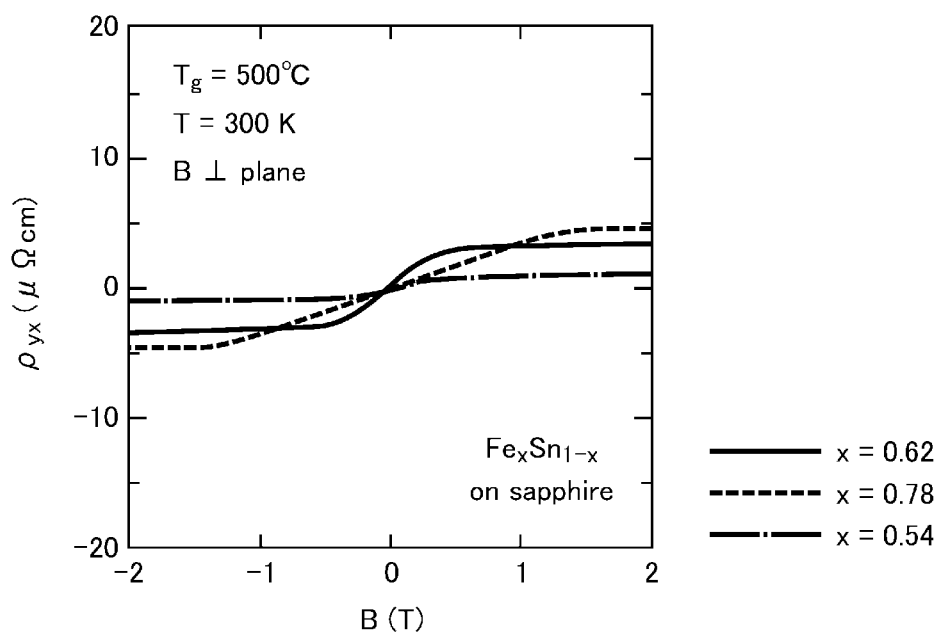
FIG. 5C is a graph showing magnetic field dependence of Hall resistivity when applying a magnetic field in an out-of-plane direction at T=300K to $Fe_xSn_{1-x}$ films with x=0.54, 0.62, and 0.78, grown at 500° C.
Figure 5D:
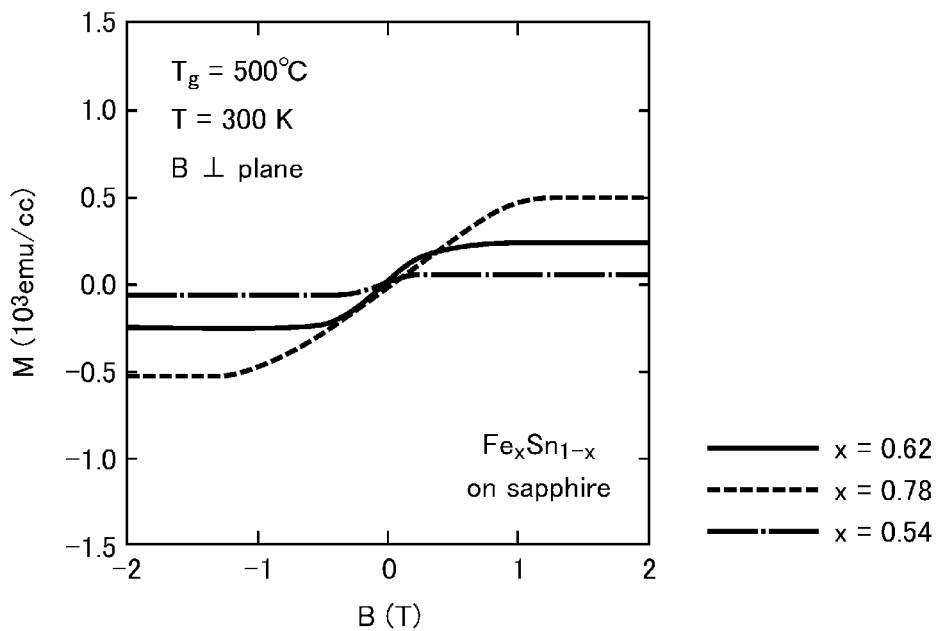
FIG. 5D is a graph showing magnetic field dependence of magnetization when applying a magnetic field in an out-of-plane direction at T=300K to the $Fe_xSn_{1-x}$ films with x=0.54, 0.62, and 0.78, grown at 500° C.

FIG. 5A and FIG. 5B show magnetic field dependence of Hall resistivity $\rho_{yx}$ and magnetization M measured when applying the magnetic field B in an out-of-plane direction at T=300K to non-crystalline $Fe_xSn_{1-x}$ films with different x, grown on sapphire substrates at room temperature. FIG. 5C and FIG. 5D show magnetic field dependence of the Hall resistivity $\rho_{yx}$ and the magnetization M measured when applying the magnetic field B in an out-of-plane direction at T=300K to crystalline $Fe_xSn_{1-x}$ films with different x, grown on sapphire substrates at high temperature. As it is obvious from FIG. 5A to FIG. 5D, the behavior of the Hall resistivity $\rho_{yx}$ is remarkably similar to magnetization curves, indicating that the response of the Hall resistivity $\rho_{yx}$ results from the anomalous Hall effect, and an anomalous Hall effect contribution is dominant over an ordinary Hall effect contribution. However, FIG. 5C and FIG. 5D suggest that high-temperature growth for x=0.54 exhibits an extremely small anomalous Hall effect.

Figure 5E:
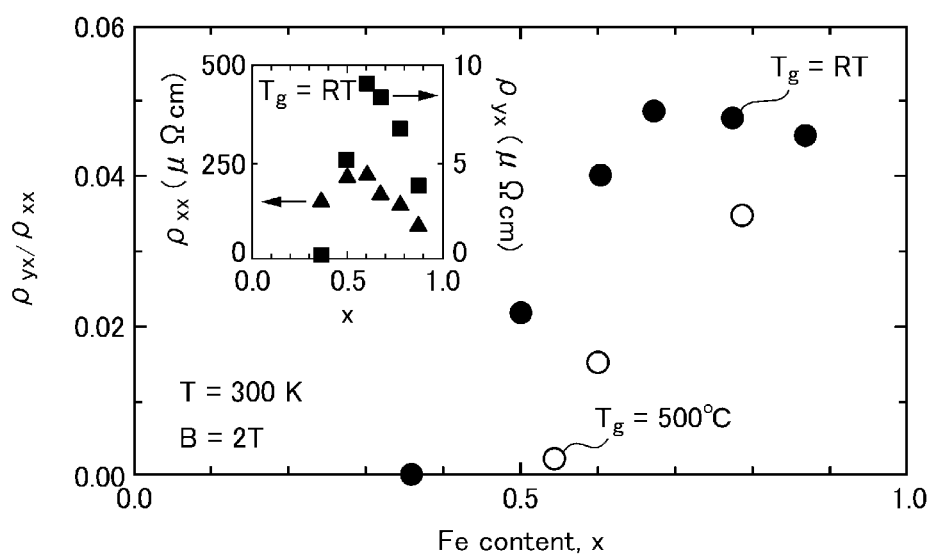
FIG. 5E is a graph showing x dependence of $\rho_{yx}/\rho_{xx}$ at B=2 T and T=300K for $Fe_xSn_{1-x}$ films grown at room temperature and $Fe_xSn_{1-x}$ films grown at high temperature.

FIG. 5E shows x dependence of $\rho_{yx}/\rho_{xx}$ at B=2 T and T=300K for non-crystalline $Fe_xSn_{1-x}$ films grown at room temperature (filled circles) and crystalline $Fe_xSn_{1-x}$ films grown at high temperature (open circles). Here, $\rho_{xx}$ is longitudinal resistivity. The inset of FIG. 5E shows the longitudinal resistivity $\rho_{xx}$ (triangles) and the Hall resistivity $\rho_{yx}$ (squares) for the non-crystalline $Fe_xSn_{1-x}$ films. The inset of FIG. 5E indicates that the Hall resistivity $\rho_{yx}$ has a sharp peak in the vicinity of x=0.60 and the longitudinal resistivity $\rho_{xx}$ is slightly changed with respect to x. As a result, as shown in FIG. 5E, $\rho_{yx}/\rho_{xx}$ for the non-crystalline films is 0.02 or more in 0.50≤x<0.90, in particular, is maximized (approximately 0.05) in the vicinity of x=0.60 to 0.75. $\rho_{yx}/\rho_{xx}$ of the crystalline films shows a similar behavior, but is smaller than $\rho_{yx}/\rho_{xx}$ of the non-crystalline films.

Figure 5F:
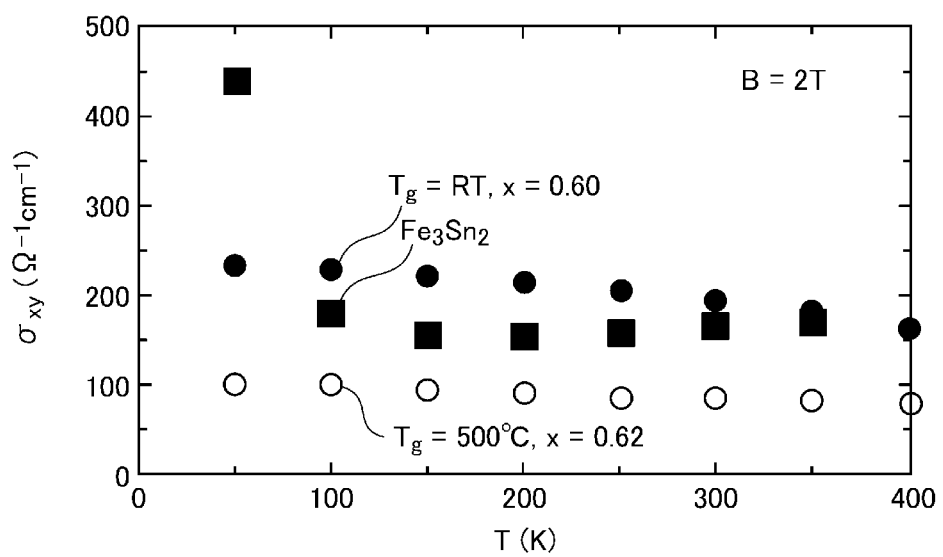
FIG. 5F is a graph showing temperature dependence of Hall conductivity for $Fe_{0.60}Sn_{0.40}$ films and $Fe_{0.62}Sn_{0.38}$ films.

FIG. 5F shows temperature dependence of Hall conductivity $\sigma_{xy}=\rho_{yx}/(\rho_{xx}^2+\rho_{yx}^2)$ for non-crystalline $Fe_{0.60}Sn_{0.40}$ films (filled circles) and crystalline $Fe_{0.62}Sn_{0.38}$ films (open circles). For reference, in FIG. 5F, data plots (squares) of bulk $Fe_3Sn_2$ single crystals described in the following literature are also included:

Ye, L. et al. "Massive Dirac fermions in a ferromagnetic kagome metal," Nature 555, 638-642 (2018).

FIG. 5F indicates that the Hall conductivity $\sigma_{xy}$ of the crystalline films rarely depends on the temperature T, and resembles the intrinsic behavior of the $Fe_3Sn_2$ single crystals, but is smaller than the Hall conductivity $\sigma_{xy}$ of the bulk $Fe_3Sn_2$, suggesting that the crystallization of $Fe_3Sn_2$ is accelerated by high-temperature sputtering ($T_g$=500° C.) to form polycrystals. In stark contrast, the Hall conductivity $\sigma_{xy}$ of the non-crystalline films rivals the Hall conductivity $\sigma_{xy}$ of the bulk $Fe_3Sn_2$ over a wide range of temperature.

Next, the sensitivity of the Hall element 100 will be described.

For the ordinary Hall effect sensing, the Hall voltage $V_{yx}$ when driving with a constant voltage is defined as Equation (1).

$$V_{yx} = \mu\left(\frac{W}{L}\right)BV_{in} \tag{1}$$

Here, $\mu$ is a mobility, and $V_{in}$ is an input voltage for allowing an electric current to flow (the longitudinal voltage $V_{xx}$ shown in FIG. 1 and FIG. 2). Hence, the Hall voltage $V_{yx}$ is determined by the mobility $\mu$ except for the magnetic field B and a geometrical factor W/L, and the sensitivity can be obtained from the mobility $\mu$.

For the anomalous Hall effect sensing, on the other hand, the Hall voltage $V_{yx}$ is defined as Equation (2)

$$V_{yx} = \frac{\rho_{yx}}{d}I_{in} = \frac{W}{L}\frac{\rho_{yx}}{\rho_{xx}}V_{in} \tag{2}$$

Here, $I_{in}$ represents an electric current (the electric current I shown in FIG. 1 and FIG. 2), and the Hall resistivity $\rho_{yx}$ is a function of the magnetic field B. From Equation (2), the sensitivity of the Hall element 100 can be obtained from $d\rho_{yx}/dB$ and $\rho_{yx}/\rho_{xx}$.

In order to compare temperature stability of an ordinary semiconductor Hall element with that of the Hall element utilizing the anomalous Hall effect, the temperature stability of the mobility p and that of $\rho_{yx}/\rho_{xx}$ are used as their indexes, respectively. The temperature stability in this $\rho_{yx}/\rho_{xx}$ term is high, and thus, the temperature stability of the Hall element 100 of the embodiments is more excellent than that of the ordinary semiconductor Hall element.

A sensitivity coefficient is given by Equation (3).

$$\text{Sensitivity Coefficient} = \frac{V_{yx}}{BV_{in}}(mV/mT/V) \tag{3}$$

Substituting $V_{yx}=R_{yx}I$, $R_{yx}=\rho_{yx}/d$, $V_{in}=R_{xx}I$, and $R_{xx}=\rho_{xx}L/Wd$ into Equation (3) yields a sensitivity coefficient=$(\rho_{yx}/\rho_{xx})\times(W/L)\times(1/B)$. If $\rho_{yx}/\rho_{xx}=0.04$ from FIG. 5E, the geometrical factor W/L=1, and B=0.6 T within −0.6 T B 0.6 T which is a linear region of the magnetic field B as shown in FIG. 5A and FIG. 5B, then the sensitivity coefficient=0.04×1÷0.6=0.066 (V/T/V)=0.066 (mV/mT/V) is obtained. This value of the sensitivity coefficient is approximately ⅓ of a sensitivity coefficient of GaAs 650 Ohm element, which is approximately 0.25 mV/mT/V representing a standard sensitivity, and is expected to increase by tuning the configuration, the composition, or the like (refer to Pham Nam hai, "Super-high-sensitivity anomalous Hall effect magnetic sensor," New Technology Presentation Meetings!).

Next, the anomalous Hall effect on various substrates will be described with reference to FIG. 6 and FIG. 7.

Figure 6:
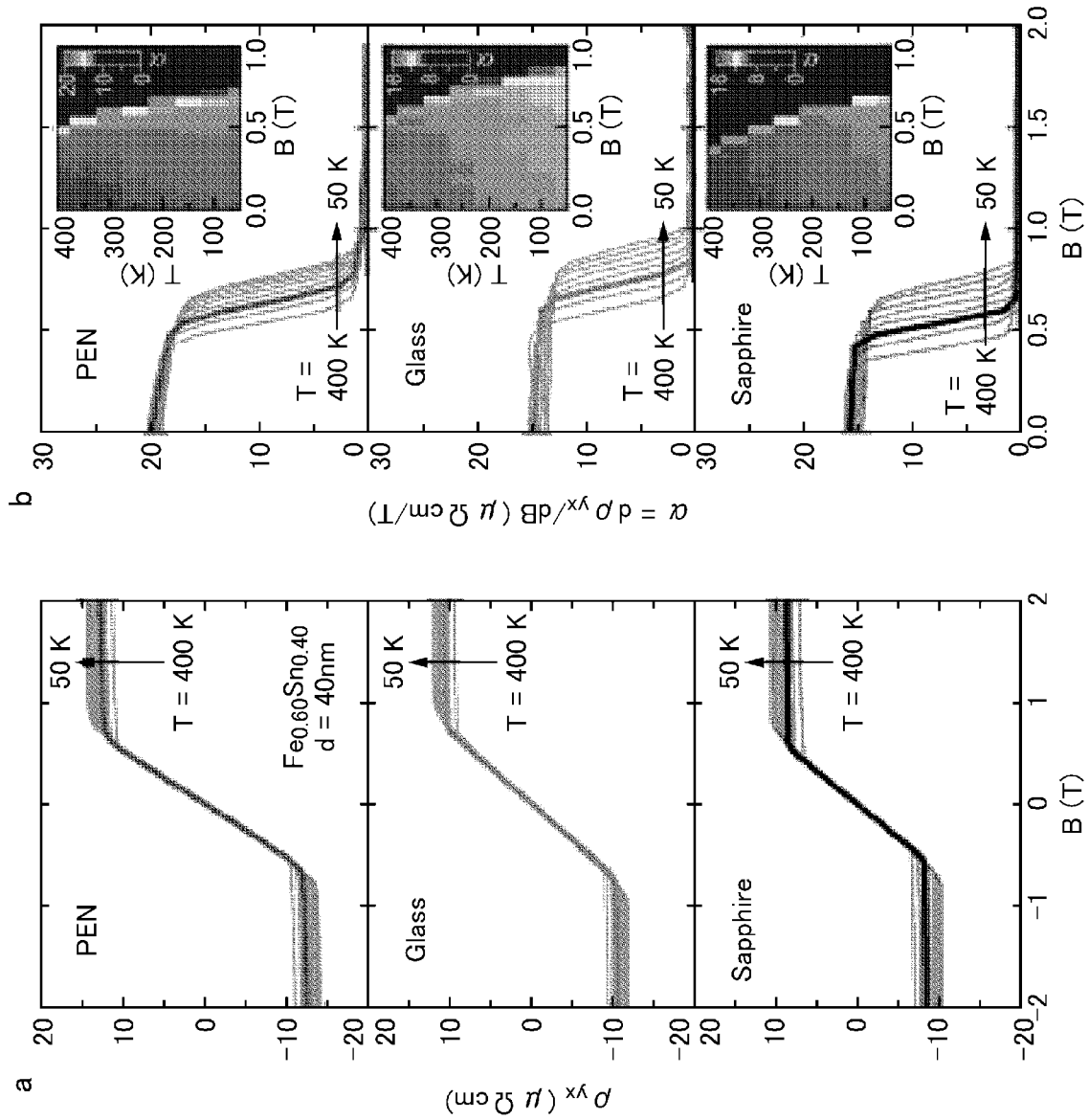
FIG. 6 is graphs showing magnetic field dependence and temperature dependence of Hall resistivity for $Fe_{0.60}Sn_{0.40}$ films with a film thickness of 40 nm, provided on a polyethylene naphthalate sheet substrate, a glass substrate, and a sapphire substrate, and graphs showing magnetic field dependence and temperature dependence of magnetic sensitivity $\alpha=d\rho_{yx}/dB$ thereof.

Graphs a of FIG. 6 show magnetic field dependence and temperature dependence of the Hall resistivity $\rho_{yx}$ for $Fe_{0.60}Sn_{0.40}$ films with a film thickness d=40 nm, provided on each of a flexible PEN sheet substrate, a glass substrate, and a sapphire substrate. The Hall resistivity $\rho_{yx}$ is measured at T=50K, 100K, 150K, 200K, 250K, 300K, 350K, and 400K. Data at T=300K are indicated by a thick line. The graphs a of FIG. 6 clearly demonstrate that the anomalous Hall effects on those three substrates are essentially the same, meaning that no specific substrate is required in order to attain a giant anomalous Hall effect.

Graphs b of FIG. 6 show the results of calculating the magnetic sensitivity $\alpha=d\rho_{yx}/dB$ (B≥0 T) from data on various substrates shown in the graphs a of FIG. 6. Each inset in the graphs b of FIG. 6 shows contour plots of the magnetic sensitivity $\alpha$ against the temperature T and the magnetic field B. The graphs b of FIG. 6 indicate that the magnetic sensitivity $\alpha$ is almost constant at a high magnetic field and is rarely affected by a temperature change. This is also obvious from a variation of the magnetic sensitivity $\alpha$ as described below.

Figure 7:
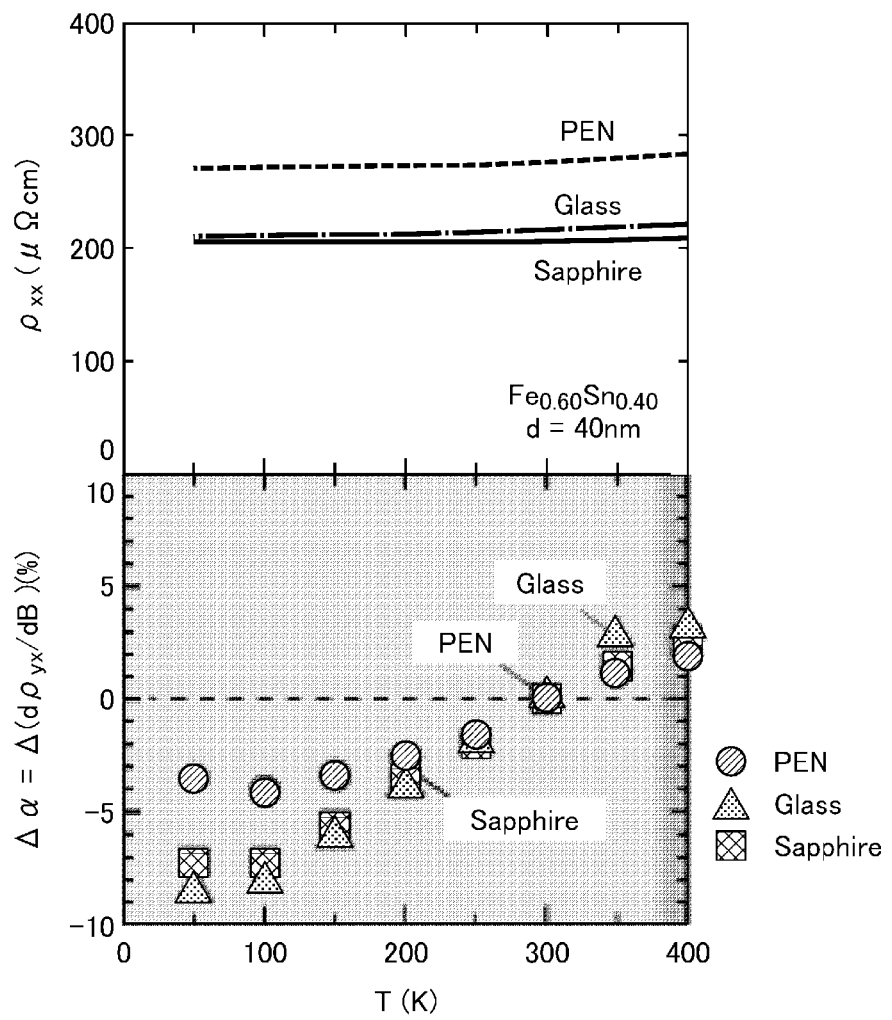
FIG. 7 is graphs showing temperature dependence of longitudinal resistivity and a variation $\Delta\alpha$ of magnetic sensitivity for $Fe_{0.60}Sn_{0.40}$ films with a film thickness of 40 nm provided on various substrates.

A lower graph of FIG. 7 shows a temperature change (variation) of the magnetic sensitivity $\alpha$ that is defined as $\Delta\alpha=(\alpha(T)-\alpha(T=300K))/\alpha(T=300K)$. This lower graph indicates that the variation $\Delta\alpha$ is within a few percent (−5% to +5%) on any of the substrates in an operation temperature range of T=200K to 400K, and is equivalent to that of IC compensated semiconductors. As shown in an upper graph of FIG. 7, a change in the longitudinal resistivity $\rho_{xx}$ with respect to the temperature T is extremely small on any of the substrates. This indicates that the Hall element 100 of the embodiments has an advantage over semiconductor devices with thermally activated transport properties.

Figure 8A:
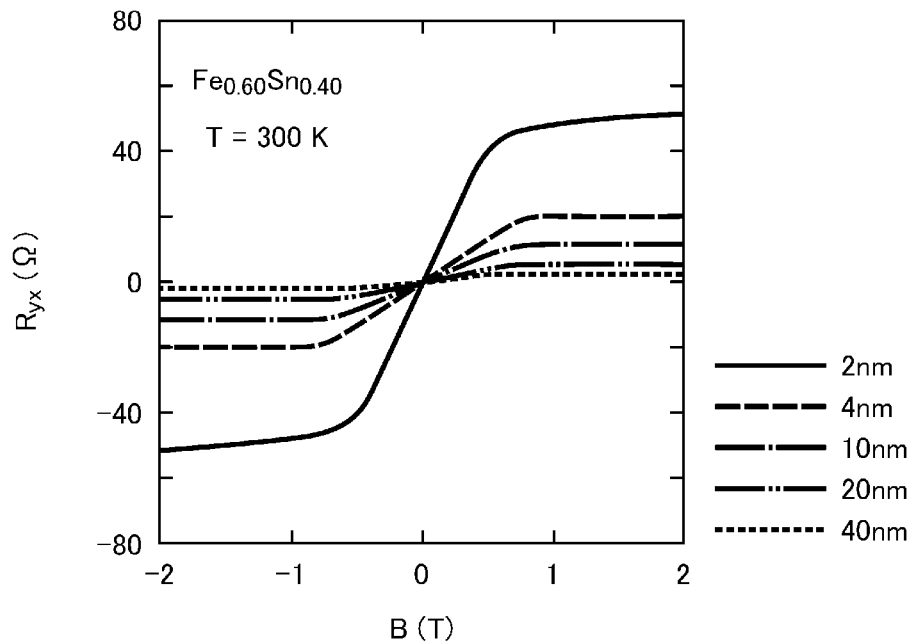
FIG. 8A is a graph showing magnetic field dependence of Hall resistance measured for various film thicknesses.
Figure 8B:
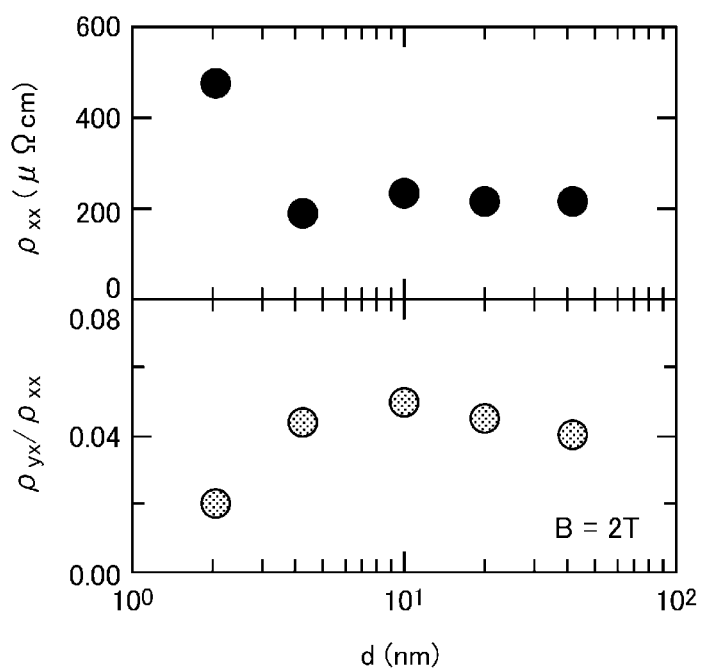
FIG. 8B is a graph showing film thickness dependence of longitudinal resistivity, and film thickness dependence of a ratio between Hall resistivity and longitudinal resistivity.

Next, in order to further increase the Hall voltage ($V_{yx}=I\times R_{yx}=I\times\rho_{yx}/d$) from the viewpoint of the film thickness d, film thickness dependence of the anomalous Hall effect will be described. FIG. 8A shows magnetic field dependence of the Hall resistance $R_{yx}$ for $Fe_{0.60}Sn_{0.40}$ films at T=300K, measured with the film thickness d=2 nm, 4 nm, 10 nm, 20 nm, and 40 nm. In addition, FIG. 8B shows film thickness dependence of the longitudinal resistivity $\rho_{xx}$ and $\rho_{yx}/\rho_{xx}$ for the $Fe_{0.60}Sn_{0.40}$ films. FIG. 8A and FIG. 8B indicate that with the film thickness d of 4 nm or more, $\rho_{yx}/\rho_{xx}$ can be maintained at 0.04 to 0.05, and a giant anomalous Hall effect occurs. In particular, FIG. 8B indicates that $\rho_{yx}/\rho_{xx}$ is maintained at approximately a constant value with the film thickness d of 20 nm or more, implying almost no film thickness dependence. On the other hand, when the film thickness decreases to d=2 nm, the longitudinal resistivity $\rho_{xx}$ rapidly increases, and $\rho_{yx}/\rho_{xx}$ rapidly decreases. The change of the width W and/or the length L other than the film thickness d to fabricate a new Hall element may lead to the enhancement of the anomalous Hall effect.

Next, bending measurement of the Hall element 100 will be described.

As shown in FIG. 9A and FIG. 9B, two types of devices (an x-bent device and a y-bent device), each attached to a surface of a semicircular jig with a radius of 4.9 mm, are prepared. Each of the x-bent device and the y-bent device is the Hall element 100 in which an $Fe_{0.60}Sn_{0.40}$ film with d=4 nm is provided on a flexible PEN sheet substrate. The x-bent device shown in FIG. 9A is attached to the semicircular jig such that the direction of the electric current I is parallel to a circumferential direction of the semicircular jig. The y-bent device shown in FIG. 9B is attached to the semicircular jig such that the direction of the electric current I is parallel to an axial direction of the semicircular jig.

Figure 10A:
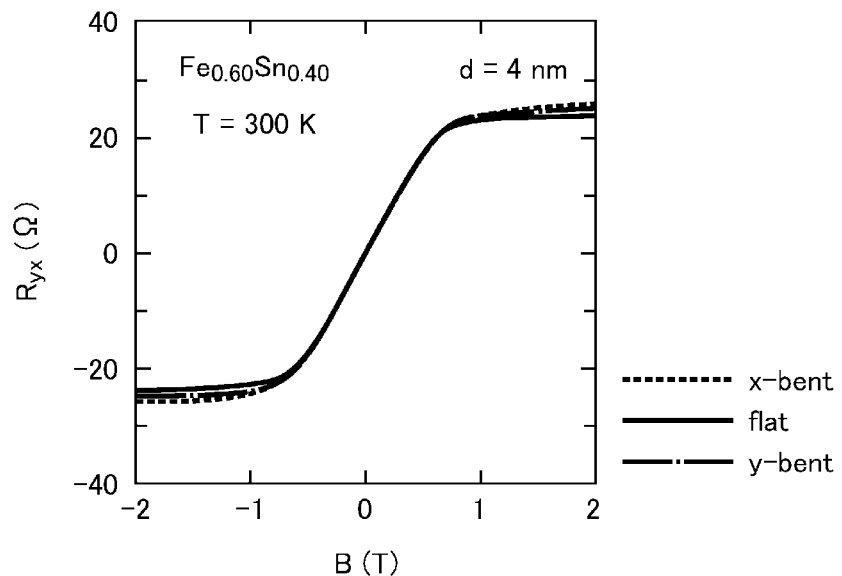
FIG. 10A is a graph showing magnetic field dependence of Hall resistance for Hall elements in a flat state and bent states.
Figure 10B:
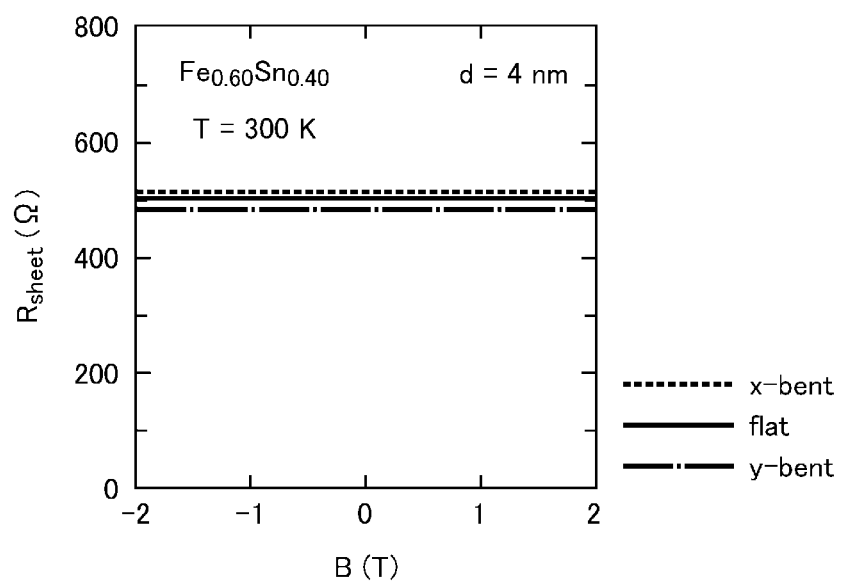
FIG. 10B is a graph showing magnetic field dependence of sheet resistance for Hall elements in a flat state and bent states.
Figure 13A:
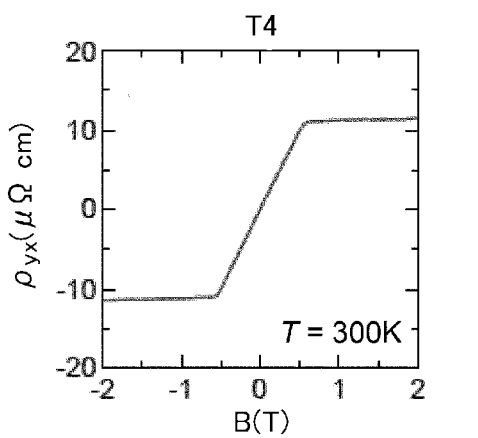
FIG. 13A is a graph showing magnetic field dependence of Hall resistivity when a thin film is made of $Fe_{0.491}Sn_{0.278}Ta_{0.231}$.
Figure 13B:
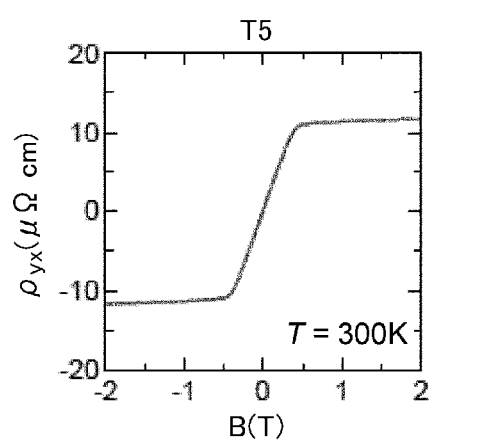
FIG. 13B is a graph showing magnetic field dependence of Hall resistivity when a thin film is made of $Fe_{0.446}Sn_{0.326}Ta_{0.228}$.
Figure 13C:
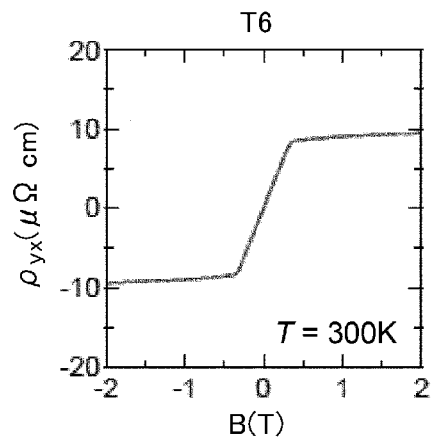
FIG. 13C is a graph showing magnetic field dependence of Hall resistivity when a thin film is made of $Fe_{0.434}Sn_{0.313}Ta_{0.253}$.
Figure 13D:
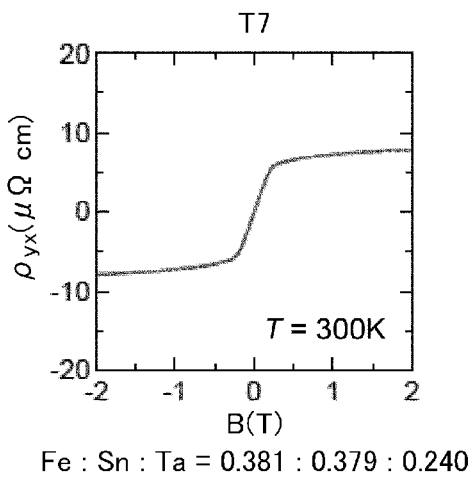
FIG. 13D is a graph showing magnetic field dependence of Hall resistivity when a thin film is made of $Fe_{0.381}Sn_{0.379}Ta_{0.240}$.
Figure 13E:
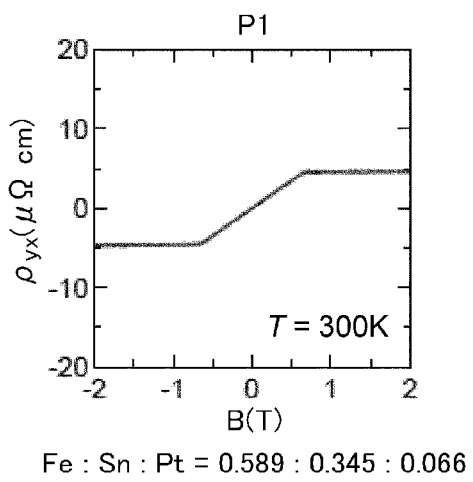
FIG. 13E is a graph showing magnetic field dependence of Hall resistivity when a thin film is made of $Fe_{0.589}Sn_{0.345}Pt_{0.066}$.
Figure 13F:
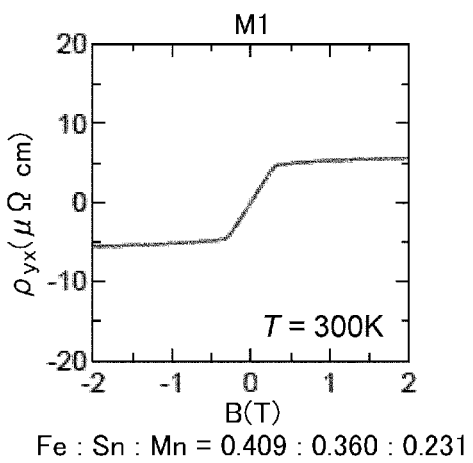
FIG. 13F is a graph showing magnetic field dependence of Hall resistivity when a thin film is made of $Fe_{0.409}Sn_{0.360}Mn_{0.231}$.
Figure 13G:
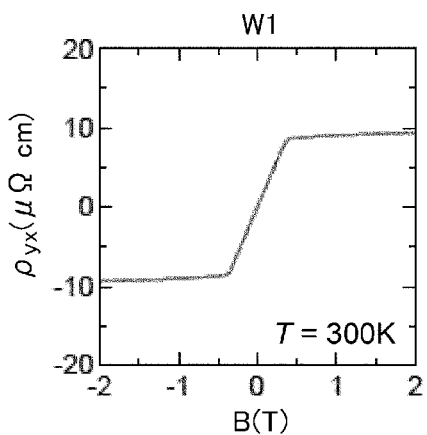
FIG. 13G is a graph showing magnetic field dependence of Hall resistivity when a thin film is made of $Fe_{0.551}Sn_{0.349}W_{0.100}$.
Figure 13H:
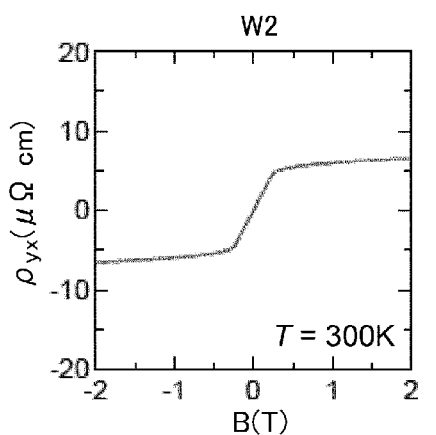
FIG. 13H is a graph showing magnetic field dependence of Hall resistivity when a thin film is made of $Fe_{0.541}Sn_{0.325}W_{0.134}$.
Figure 13I:
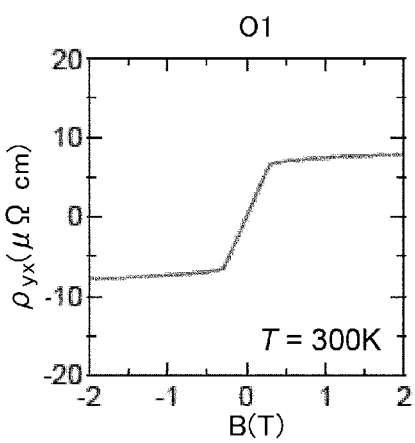
FIG. 13I is a graph showing magnetic field dependence of Hall resistivity when a thin film is made of $Fe_{0.575}Sn_{0.347}Mo_{0.078}$.

FIG. 10A shows magnetic field dependence of the Hall resistance $R_{yx}$ for a Hall element in a flat state and Hall elements in bent states (that is, the x-bent device and the y-bent device), and FIG. 10B shows magnetic field dependence of sheet resistance $R_{sheet}$ for such Hall elements. As it is obvious from FIG. 10A and FIG. 10B, no remarkable difference is found in the anomalous Hall effect between the flat state and the bent states, and damage including fracture does not occur in a range of a measured curvature radius.

As described above, according to Example 1, providing the Hall element 100 including the thin film 2 made of a non-toxic and inexpensive alloy of Fe and Sn ($Fe_xSn_{1-x}$ (0.5≤x<0.9)) enables stability in a wide range of temperature including a room temperature, and detection of the Hall voltage as with the conventional semiconductors. In addition, it is possible to prepare the highly-uniform thin film 2 on the substrate 1 by a general-purpose technique such as sputtering. It is also possible to achieve a linear output (a soft magnetic body) in a comparatively wide range of magnetic field (for example, in a range of −0.6 T to +0.6 T). Further, the material of the substrate 1 is not particularly limited, unlike substrates used in the conventional Hall elements, such as a GaAs single-crystalline substrate. In addition, a flexible substrate can also be employed. This makes it possible to achieve a small and lightweight Hall element 100.

Example 2

Example 2 demonstrates the anomalous Hall effect when the thin film 2 is a ternary compound containing an Fe—Sn alloy and a dopant element (impurity), and the dopant element is a transition metal element that is added in order to modulate spin-orbit coupling or magnetism.

In Example 2, the thin film 2 containing a ternary compound is provided on the sapphire substrate 1.

FIG. 11 shows properties of an Fe—Sn alloy as a non-doped reference sample that is used in the measurement of an impurity doping effect or comparative verification. FIG. 11 shows sample IDs of five Fe—Sn alloys as non-doped reference samples denoted by N1 to N5, respectively, and results of measuring the film thickness d, the Hall resistivity $\rho_{yx}$ at the magnetic field B=2 T, $\rho_{yx}/\rho_{xx}$ at the magnetic field B=2 T, the magnetic sensitivity $d\rho_{yx}/dB$ at the magnetic field B≤0.2 T, a carrier density, and a composition ratio, for each of the non-doped reference samples. The composition ratio represents the results from energy dispersive X-ray spectrometry (EDX). The carrier density of the non-doped reference samples N1 and N3 to N5 is not analyzed.

In Example 2, experiments of adding each of tantalum (Ta), tungsten (W), molybdenum (Mo), platinum (Pt), and manganese (Mn) to a non-doped reference sample N2 are performed by room-temperature sputtering. The addition of Ta, the addition of W, the addition of Mo, and the addition of Pt are mainly aimed at modulating spin-orbit coupling, and the addition of Mn is mainly aimed at modulating magnetism.

In Example 2, let us suppose that an Fe site of the non-doped reference sample N2 is substituted with a dopant X, and a doping level representing a doping rate is defined as X/(Fe+X).

FIG. 12A shows experimental results of adding Ta to the non-doped reference sample N2, and FIG. 12B shows experimental results of adding W to the non-doped reference sample N2, adding Mo to the non-doped reference sample N2, adding Pt to the non-doped reference sample N2, and adding Mn to the non-doped reference sample N2. FIG. 12A and FIG. 12B show the dopant X, the sample ID, the film thickness d, the Hall resistivity $\rho_{yx}$ at the magnetic field B=2 T, $\rho_{yx}/\rho_{xx}$ at the magnetic field B=2 T, the magnetic sensitivity $d\rho_{yx}/dB$ at the magnetic field B≤0.2 T, the carrier density, the composition ratio obtained from EDX, and the doping level, for each experiment.

In FIG. 12A, nine sample IDs of the dopant Ta are denoted by T1 to T9 in ascending order of the doping level. In FIG. 12B, two sample IDs of the dopant W are denoted by W1 and W2 in ascending order of the doping level, a sample ID of the dopant Mo is denoted by O1, a sample ID of the dopant Pt is denoted by P1, and a sample ID of the dopant Mn is denoted by M1.

In the samples T8 and T9, magnetic field dependence of the Hall resistivity $\rho_{yx}$ is non-linear in the measured magnetic field range, and thus, the magnetic sensitivity $d\rho_{yx}/dB$ and the carrier density are not obtained.

FIG. 13A, FIG. 13B, FIG. 13C, and FIG. 13D show magnetic field dependence of the Hall resistivity $\rho_{yx}$ for the samples T4, T5, T6, and T7 at T=300K, respectively, and FIG. 13E, FIG. 13F, FIG. 13G, FIG. 13H, and FIG. 13I show magnetic field dependence of the Hall resistivity $\rho_{yx}$ for the samples P1, M1, W1, W2, and O1 at T=300K, respectively.

Figure 14:
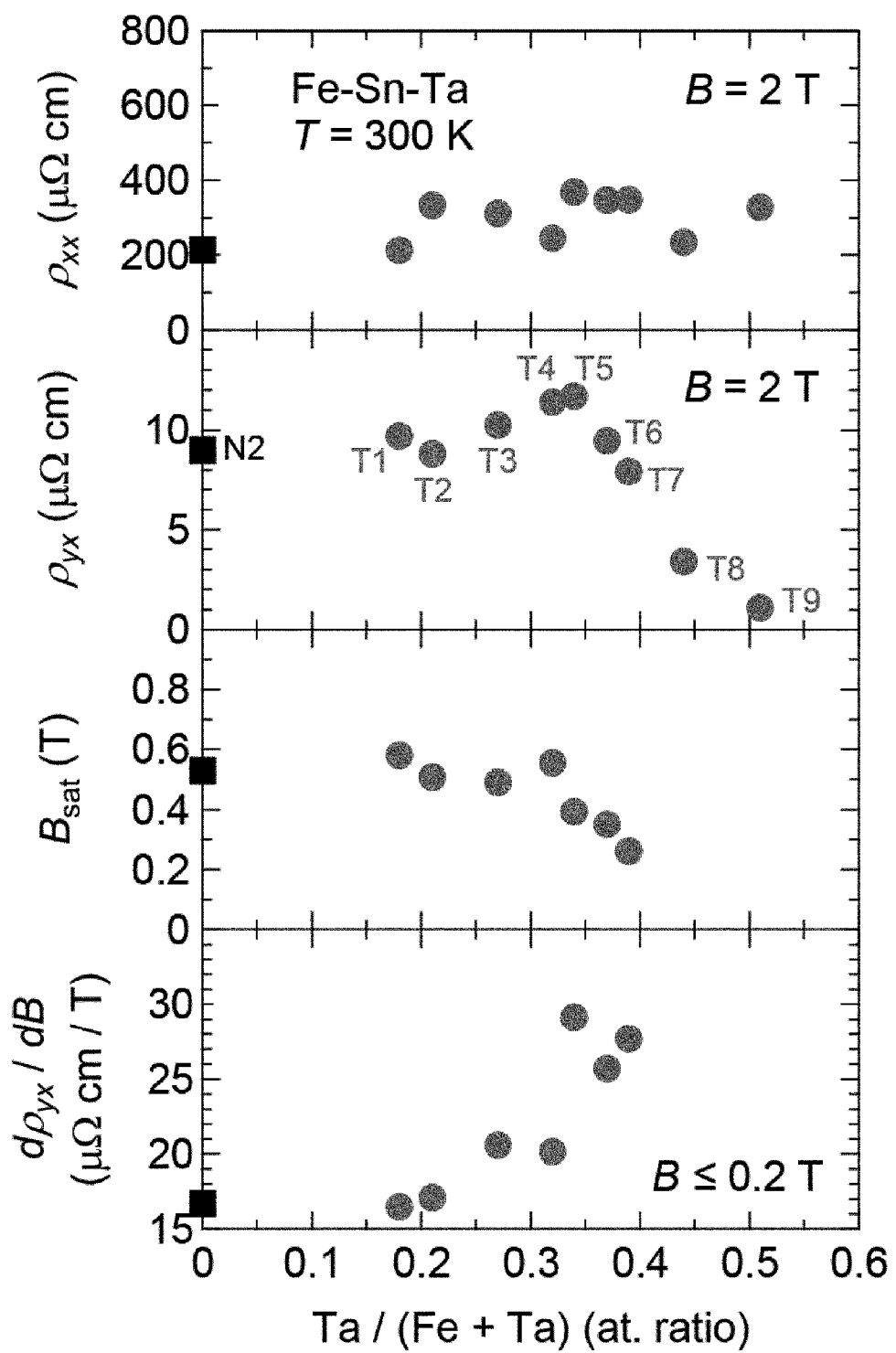
FIG. 14 is graphs of composition dependence of longitudinal resistivity, Hall resistivity, a saturation magnetic field, and a magnetic sensitivity when a thin film is made of Fe, Sn, and Ta.

FIG. 14 shows the longitudinal resistivity $\rho_{xx}$ at the magnetic field B=2 T, the Hall resistivity $\rho_{yx}$ at the magnetic field B=2 T, a saturation magnetic field $B_{sat}$, and composition dependence (doping level dependence) of the magnetic sensitivity $d\rho_{yx}/dB$ at T=300K and the magnetic field B≤0.2 T, for the samples T1 to T9 obtained from the experiments of adding Ta to the non-doped reference sample N2, and for the non-doped reference sample N2.

As shown in FIG. 12A and FIG. 14, the Hall resistivity $\rho_{yx}$ of the samples T1 and T3 to T6 is higher than that of the non-doped reference sample N2, and the magnetic sensitivity $d\rho_{yx}/dB$ of the samples T2 to T7 is higher than that of the non-doped reference sample N2. As shown in FIG. 12A, $\rho_{yx}/\rho_{xx}$ of the samples T1 and T4 is higher than that of the non-doped reference sample N2. As shown in FIG. 12B, the magnetic sensitivity $d\rho_{yx}/dB$ of the samples W1, W2, and O1 is higher than that of the non-doped reference sample N2.

FIG. 12A and FIG. 14 suggest that for the samples T3, T4, T5, and T6 (the doping level=0.27 to 0.37), both of the Hall resistivity $\rho_{yx}$ and the magnetic sensitivity $d\rho_{yx}/dB$ are enhanced compared to the non-doped reference sample N2, indicating that even larger anomalous Hall effect occurs.

For the samples T5, T6, and T7, as shown in FIG. 12A, FIG. 13B to FIG. 13D, and FIG. 14, the magnetic sensitivity $d\rho_{yx}/dB$ at a low magnetic field (B≤0.2 T) is extremely high compared to the non-doped reference sample N2. In particular, for the sample T5, both of the Hall resistivity $\rho_{yx}$ and the magnetic sensitivity $d\rho_{yx}/dB$ are the highest, and the magnetic sensitivity $d\rho_{yx}/dB$ (29.1 μΩcm/T) even approaches twice that of the non-doped reference sample N2.

In contrast, FIG. 13B to FIG. 13D and FIG. 14 suggest that the saturation magnetic field $B_{sat}$ (a maximum detectable magnetic field) of the samples T5, T6, and T7 is slightly less than that of the non-doped reference sample N2, but is maintained at approximately 0.2 T to 0.4 T.

As shown in FIG. 8B, for the Fe—Sn alloy of Example 1, $\rho_{yx}/\rho_{xx}$ rarely depends on the film thickness d at the film thickness of 20 nm or more. In Example 2, as shown in FIG. 12A and FIG. 12B, the film thicknesses d of all of the samples T1 to T9, W1, W2, O1, P1, and M1 are in a range of 35 nm to 65 nm, which is sufficiently greater than 20 nm. Accordingly, a change in various parameters such as the Hall resistivity $\rho_{yx}$, $\rho_{yx}/\rho_{xx}$, and the magnetic sensitivity $d\rho_{yx}/dB$ rarely depends on the film thickness d, and the improvement of the properties of the samples in Example 2 is attributed to impurity doping.

Example 3

Example 3 demonstrates the anomalous Hall effect when the thin film 2 is a ternary compound containing an Fe—Sn alloy and a dopant element (impurity), and the dopant element is a main-group element that is added in order to modulate carrier density or density of states.

Also in Example 3, the thin film 2 containing a ternary compound is provided on the sapphire substrate 1.

In Example 3, experiments of adding each of indium (In) and germanium (Ge) to the non-doped reference sample N2 are performed by room-temperature sputtering. The experimental conditions are the same as those of Example 2. The addition of In having a different number of valence electrons from that of Sn is aimed at modulating carrier density, and the addition of Ge is mainly aimed at modulating density of states.

In Example 3, let us suppose that an Sn site of the non-doped reference sample N2 is substituted with a dopant X, and a doping level representing a doping rate is defined as X/(Sn+X).

FIG. 15 shows experimental results of adding In to the non-doped reference sample N2 and adding Ge to the non-doped reference sample N2. FIG. 15 shows the dopant X, the sample ID, the film thickness d, the Hall resistivity $\rho_{yx}$ at the magnetic field B=2 T, $\rho_{yx}/\rho_{xx}$ at the magnetic field B=2 T, the magnetic sensitivity $d\rho_{yx}/dB$ at the magnetic field B≤0.2 T, the carrier density, the composition ratio obtained from EDX, and the doping level, for each experiment.

In FIG. 15, two sample IDs of the dopant In are denoted by I1 and I2 in ascending order of the doping level, and a sample ID of the dopant Ge is denoted by G1.

Figure 16A:
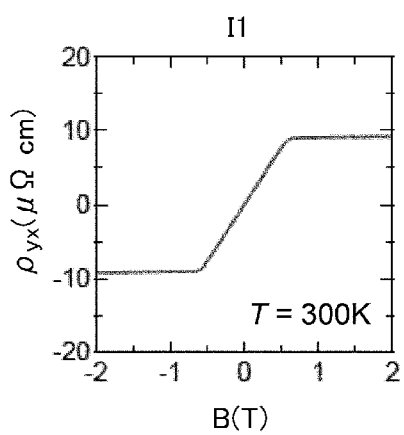
FIG. 16A is a graph showing magnetic field dependence of Hall resistivity when a thin film is made of $Fe_{0.611}Sn_{0.308}In_{0.081}$.
Figure 16B:
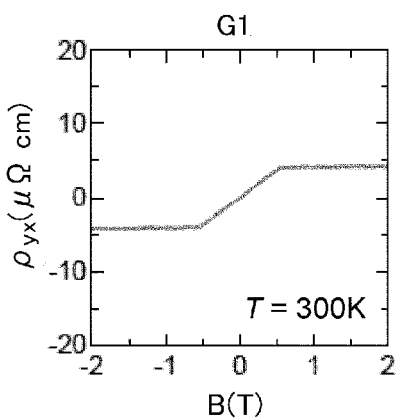
FIG. 16B is a graph showing magnetic field dependence of Hall resistivity when a thin film is made of $Fe_{0.583}Sn_{0.300}Ge_{0.117}$.

FIG. 16A and FIG. 16B show magnetic field dependence of Hall resistivity $\rho_{yx}$ for the samples I1 and G1 at T=300K, respectively.

As shown in FIG. 15, the Hall resistivity $\rho_{yx}$ of the sample I1 is higher than that of the non-doped reference sample N2, and $\rho_{yx}/\rho_{xx}$ of the samples I1 and I2 is higher than that of the non-doped reference sample N2. This indicates that a giant anomalous Hall effect occurs in the samples I1 and I2.

As shown in FIG. 15, also in Example 3, the film thicknesses d of all of the samples I1, I2, and G1 are sufficiently greater than 20 nm. Accordingly, a change in various parameters such as the Hall resistivity $\rho_{yx}$, $\rho_{yx}/\rho_{xx}$, and the magnetic sensitivity $d\rho_{yx}/dB$ rarely depends on the film thickness d, and the improvement of the properties of the samples in Example 3 is attributed to impurity doping.

Figure 17:
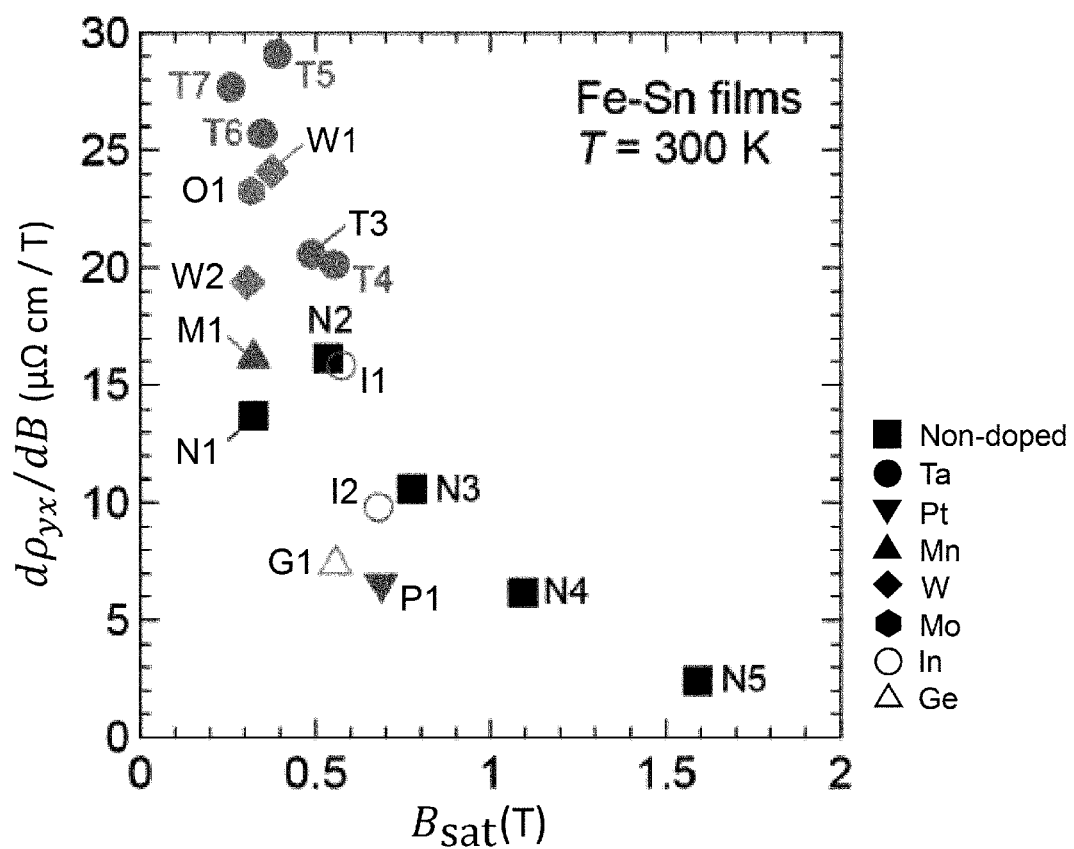
FIG. 17 is a graph showing a relationship between a saturation magnetic field and a magnetic sensitivity for ternary compounds and non-doped reference samples according to Example 2 and Example 3.

FIG. 17 shows a relationship between the saturation magnetic field $B_{sat}$ and the magnetic sensitivity $d\rho_{yx}/dB$ for the ternary compounds and the non-doped reference samples N1 to N5 according to Example 2 and Example 3.

The data of the samples T3 to T7, W1, W2, and O1 clearly demonstrates that adding Ta, W, or Mo to the non-doped reference sample N2 significantly enhances the magnetic sensitivity $d\rho_{yx}/dB$ in a low magnetic field region, compared to the non-doped reference sample N2.

The data of the non-doped reference samples N1 to N5 clearly demonstrates that simply tuning the composition of the Fe—Sn alloy does not provide the magnetic sensitivity $d\rho_{yx}/dB$ equivalent to that of the samples T3 to T7, W1, W2, and O1.

A heavy transition metal element such as Ta or W has a strong spin-orbit coupling, and the spin-orbit coupling can be increased by adding such a heavy transition metal element to the Fe—Sn alloy.

The experimental conditions for adding the impurity described in Example 2 and Example 3 are presented for the purposes of illustration and not limitation. For example, the impurity may be added by a method other than sputtering. In addition, a plurality of impurities may be added. Moreover, the thin film may be provided on a substrate made of a material other than sapphire. In addition, in Example 3, if Sb is added as a main-group element having a different number of valence electrons from that of Sn to modulate carrier density, the anomalous Hall effect may occur.

REFERENCE SIGNS LIST

100: Hall element
1: Substrate
2: Thin film
21, 22, 23, 24, 25, 26: Terminal

The invention claimed is:

1. A Hall element that exhibits an anomalous Hall effect, comprising:
   a substrate; and
   a thin film as a magneto-sensitive layer on the substrate, the thin film being non-crystalline and having a composition of $Fe_xSn_{1-x}$, where 0.5≤x<0.9.

2. The Hall element according to claim 1, wherein the substrate is made of one of polyethylene naphthalate, polyethylene terephthalate, polyimide, glass, sapphire, alumina, magnesium oxide, strontium titanate, quartz, silicon, gallium arsenide, and indium phosphide.

3. The Hall element according to claim 1, wherein a variation of magnetic sensitivity on the substrate is in a range of −5% to +5% in a temperature range of 200K to 400K.

4. The Hall element according to any one of claim 1, wherein the thin film has a thickness of 4 nm to 40 nm.

5. The Hall element according to any one of claim 1, wherein the substrate is a flexible substrate.

6. A Hall element that exhibits an anomalous Hall effect, comprising:
   a substrate; and
   a thin film as a magneto-sensitive layer on the substrate, wherein
   the thin film is made of an alloy of Fe and Sn, and a dopant element, and
   the dopant element is a transition metal element that modulates spin-orbit coupling or magnetism.

7. The Hall element according to claim 6, wherein the thin film has a thickness of 35 nm to 65 nm.

8. A Hall element that exhibits an anomalous Hall effect, comprising:
   a substrate; and
   a thin film as a magneto-sensitive layer on the substrate, wherein
   the thin film is made of an alloy of Fe and Sn, and a dopant element, and
   the dopant element is a main-group element that has a different number of valence electrons from Sn and modulates carrier density.

9. A Hall element that exhibits an anomalous Hall effect, comprising:
   a substrate; and
   a thin film as a magneto-sensitive layer on the substrate, wherein
   the thin film is made of an alloy of Fe and Sn, and a dopant element, and
   the dopant element is a main-group element that modulates density of states.

\* \* \* \* \*